US006258191B1

(12) United States Patent
Fasano et al.

(10) Patent No.: US 6,258,191 B1
(45) Date of Patent: Jul. 10, 2001

(54) METHOD AND MATERIALS FOR INCREASING THE STRENGTH OF CRYSTALLINE CERAMIC

(75) Inventors: Benjamin V. Fasano, New Windsor; Lewis S. Goldmann, Bedford; Richard F. Indyk, Wappingers Falls, all of NY (US); Sundar M. Kamath, San Jose, CA (US); Scott I. Langenthal, Hyde Park; Srinivasa S. Reddy, Lagrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/153,988

(22) Filed: Sep. 16, 1998

(51) Int. Cl.⁷ .............................. B32B 31/26; H05K 1/03
(52) U.S. Cl. .................................. 156/89.12; 156/89.16; 428/901
(58) Field of Search ........................... 156/89.11, 89.12, 156/89.14, 89.16, 89.17, 89.18, 89.19, 89.21; 428/210, 901

(56) References Cited

U.S. PATENT DOCUMENTS

| | | |
|---|---|---|
| 2,108,513 | 2/1938 | Shardlow . |
| 2,966,719 | 1/1961 | Park, Jr. . |
| 3,698,923 | 10/1972 | Stetson et al. . |
| 3,812,689 * | 5/1974 | Reade . |
| 3,854,919 | 12/1974 | Pirooz . |
| 3,873,329 * | 3/1975 | Beall . |
| 3,911,188 | 10/1975 | Torti, Jr. et al. . |
| 3,940,255 * | 2/1976 | Harrington et al. . |
| 3,988,405 | 10/1976 | Smith et al. . |
| 4,100,001 * | 7/1978 | Franklin . |
| 4,234,367 * | 11/1980 | Herron et al. . |
| 4,301,324 * | 11/1981 | Kumar et al. . |
| 4,340,635 | 7/1982 | Langman et al. . |
| 4,506,024 | 3/1985 | Claussen et al. . |
| 4,540,671 * | 9/1985 | Kondo et al. . |
| 4,582,813 | 4/1986 | Kanda et al. . |
| 4,595,665 | 6/1986 | Takayama et al. . |
| 4,608,348 * | 8/1986 | Beall et al. . |
| 4,764,486 * | 8/1988 | Ishihara et al. . |
| 4,769,294 | 9/1988 | Barringer et al. . |
| 4,781,970 * | 11/1988 | Barbee et al. . |
| 4,897,509 * | 1/1990 | Holleran et al. . |
| 4,980,236 | 12/1990 | Oomen et al. . |
| 5,043,223 | 8/1991 | Kumagai et al. . |
| 5,047,374 | 9/1991 | Nicholson et al. . |
| 5,065,275 | 11/1991 | Fujisaki et al. . |
| 5,387,474 | 2/1995 | Mikeska et al. . |
| 5,411,563 | 5/1995 | Yeh et al. . |
| 5,458,709 * | 10/1995 | Kaezaki et al. . |
| 5,541,005 | 7/1996 | Bezama et al. . |

* cited by examiner

*Primary Examiner*—Curtis Mayes
(74) *Attorney, Agent, or Firm*—DeLio & Peterson, LLC; John J. Tomaszewski; Aziz M. Ahsan

(57) ABSTRACT

Multilayer glass ceramic substrate electronic components having enhanced flexibility and strength are prepared using greensheets as a top and/or bottom layer, which greensheets are made from a glass-ceramic greensheet casting composition comprising crystallizable glass, a binder resin and a solvent system, and preferably a plasticizer. The top and/or bottom greensheets have a lower coefficient of thermal expansion (CTE) than the greensheets used to make the internal layers of the MLC and both greensheets are characterized by having, after sintering, a microstructure which is greater than 99% crystalline. A crystalline matrix forming material such as $P_2O_5$ is preferably used in the composition. This type structure, in combination with the lower CTE, has been found to provide an MLC having enhanced strength and flexibility.

7 Claims, No Drawings

METHOD AND MATERIALS FOR INCREASING THE STRENGTH OF CRYSTALLINE CERAMIC

BACKGROUND OF THE INVENTION

1. Field of the Invention

The present invention relates to compositions and methods for forming multilayer ceramic electronic components from flexible glass-ceramic articles termed greensheets and, in particular, to such electronic components having enhanced strength and mechanical reliability.

2. Description of Related Art

Ceramics have found widespread use in electronics as a substrate for integrated circuit packages. Metallized circuit patterns are applied to the ceramic substrate in the form of a greensheet, and ceramic and metallization are cosintered to create a monolith of substrate and circuitry. Multi-layer ceramic (MLC) circuit packages are constructed by combining ceramic particles and organic binders into unfired, or "greensheet", tape. Inter-layer electrically conductive paths, known as "vias", are then inserted (punched) through the greensheet tape and filled with a conductive metal paste, forming electrical interconnections between the circuits on each tape layer. The metallized layers are then stacked and processed to form the monolith MLC electronic component with three-dimensional circuitry.

The ceramic substrate can be made from many types of oxide and nonoxide materials. These include glasses, glasses mixed with crystalline oxides and nonoxides (referred to herein as glass plus ceramic) as well as glasses that crystallize during processing to form glass-ceramics.

The mechanical reliability of ceramic chip carriers is often related to the strength of the ceramic. Typical glass bonded alumina substrates have flexural strengths near 345 Mpa (50 K psi). These are among the highest strength materials. A disadvantage of alumna substrates made with substantial amounts of alumina is the high dielectric constant that is undesirable for high speed chip carrier packaging. Chip carriers made with high glass or glass-ceramic content can have lower dielectric constant values and are thus more desirable. Glass-ceramic substrates are often subjected to the same types of stresses encountered by alumina substrates during pin attach and flexural bending during Land Grid Array (LGA) socket insertions. The flexural strength of typical glass-ceramics is about 228 Mpa (35 K psi). To improve the reliability and expand the applications for glass-ceramic substrates, there is a need for glass-ceramics to have increased strength without increasing the complexity of manufacture or changing the composition of the MLC build process. In addition, the flexural modulus of glass-ceramic ideally is controllable to allow the lower modulus of glass to be exploited for greater second level attach reliability. These more flexible substrates can endure the motion of printed circuit boards to which they are joined without causing cracking at the solder connections.

To further increase the usefulness of this increased strength, glass-ceramic chip carriers produced using an XY constraining force that controls shrinkage during sintering are desirable. The casting of suspensions of ceramic, glass and glass-ceramic materials to form layers or sheets which are punched, patterned, layered and then sintered to produce a ceramic or glass-ceramic multilayer substrate material is known in the art. The doctor blade method is one method for producing a glass-ceramic greensheet. Typically, the glass and ceramic powders are mixed with an organic solvent, a plasticizer and a binder forming a slurry, the slurry is cast in a regulated thickness on a carrier film with the aid of a doctor blade, and the applied layer of the slurry is then dried. The glass is typically silica, the ceramic is typically alumina and a butyral type resin like polyvinyl butyral is the binder. A cellulose type resin like ethyl cellulose or polyvinyl alcohol may also be used as the binder.

Alumina and glass are typically used as the ceramic component of the greensheet for both the insulating layers and dielectric layers. The laminated greensheets are typically sintered or fired at a temperature of about 1,500° C. or higher. In view of the high sintering temperature, the vias and wiring must be made of molybdenum, tungsten, or a like conductor material having a high melting point.

There is a need, however, for MLC's which may be sintered at a lower temperature such as 800 to 1000° C. so that a more electrically conductive metal with a lower sintering temperature such as copper can be used. Attempts to increase the strength of ceramic substrates made using glass mixed with ceramic powders have included the use of a compressive layer on either or both the top and bottom layers of the MLC. U.S. Pat. Nos. 3,911,188; 4,506,024; 5,047,374; and 5,411,563 are exemplary and are incorporated herein by reference. When using surface compressive layers, the surface layer is chosen so as to have a coefficient of thermal expansion (CTE) that is lower than that of the underlying layers after sintering. This is typically performed by changing the composition of the surface layers or the ratio of the glass and ceramic components used in these greensheets.

The previously cited prior art includes processing by post sinter strengthening such as ion exchange or surface coating. These cannot easily be used for making substrates to be used as chip carriers due to interactions of these processes or coatings with surface metallization. Most desirable is a single sintering step which will produce high strength substrates with no further processing.

U.S. Pat. No. 5,411,563 references the use of glass powders in the range of 0–100% as being suitable for making precursory substrates (greensheets) for use in strengthened ceramic/glass substrates. Glass has a very low strength owing particularly to surface flaws induced during processing or environmental attack. One hundred percent glass substrates would have little or no usefulness as chip carriers due to the low strength and fracture toughness. Examples cited wherein additions to the glasses by ceramic powders improve the strength to approximately 250 Mpa when using strengthening outer layers may still not be suitable for applications where alumina-like strengths are needed.

Likewise, the presence of residual glass in the fired substrate can lead to susceptibility to chemical attack since glasses are known to be less resistant to corrosion than their crystalline counterparts.

In addition, the presence of glass after sintering can be undesirable where substrates in use may be subjected to elevated temperatures which can cause softening and deformation of the substrate.

Bearing in mind the problems and deficiencies of the prior art, it is therefore an object of the present invention to provide a glass-ceramic greensheet casting composition which provides greensheets for use as top and/or bottom layers on a multilayer glass-ceramic substrate to increase the strength and flexibility properties of the formed MLC substrate electronic component.

It is another object of the present invention to provide a glass-ceramic greensheet having enhanced strength and flexibility properties when sintered as a top and/or bottom layer of a multilayer glass-ceramic substrate.

A further object of the invention is to provide a process for producing a glass-ceramic substrate greensheet wherein the greensheet increases the strength and flexibility properties of a glass-ceramic multilayer substrate when used as the top and/or bottom layer of the substrate.

It is yet another object of the present invention to provide a process for fabricating a multilayer glass-ceramic substrate from greensheets made using the methods and composition of the invention.

Another object of the present invention is to provide greensheets and multilayer glass-ceramic substrates made from the greensheets using the compositions and/or processes of the invention.

Still other objects and advantages of the invention will in part be obvious and will in part be apparent from the specification.

SUMMARY OF THE INVENTION

The above and other objects, which will be apparent to those skilled in the art are achieved by the present invention which, in a first aspect, relates to a process for fabricating a multi-layer glass-ceramic electronic component having enhanced strength comprising the steps of:

forming a first glass-ceramic greensheet casting composition comprising crystallizable glass, a binder resin and a solvent;

forming first greensheets from the first composition, the greensheets having metallization thereon and metallized via interconnections, the first greensheets characterized by having a post fired first coefficient of thermal expansion, and a microstructure which is greater than 99% crystalline;

stacking a plurality of the first greensheets to form a first stack;

stacking on the top of the first stack, bottom of the first stack or both the top and bottom of the first stack, at least one layer of a second greensheet made using a second glass-ceramic greensheet casting composition comprising crystallizable glass, a binder resin and a solvent system, the second greensheets characterized by having a post fired second coefficient of thermal expansion which is lower than the first coefficient of thermal expansion and a microstructure which is greater than 99% crystalline; and sintering the stack to form the multi-layer glass-ceramic electronic component.

A crystallizable glass that is used is derived from a glass processed as a melt, quickly cooled to stay vitreous and then transformed into a crystalline phase by heating.

In another aspect, the present invention relates to a glass-ceramic greensheet and multilayer glass-ceramic substrate made from the greensheets by stacking the greensheets and by heating the greensheets with the stacks having as a top and/or bottom layer a glass-ceramic greensheet made from a glass-ceramic greensheet casting composition as described hereinabove. The heating cycle is commonly termed sintering and typically encompasses three (3) distinct heating stages: (1) pyrolysis up to about 500° C. to remove and break-down molecular species of the polymers used and volatilize the smaller chain organics and to remove unwanted organics; (2) burn binder out (BBO) to remove the remainder of the unwanted organics (particularly the binder) from the greensheet; and (3) sintering to move the greensheet glass-ceramic particles together into a densified body and thereafter crystallize the glass into a glass-ceramic substrate which is greater than 99% crystalline.

In another aspect of the invention, a process is provided for fabricating a multilayer glass-ceramic substrate comprising the steps of:

stacking layers of glass-ceramic greensheets having metallization thereon and metallized via interconnections to form a first stack;

placing a glass-ceramic greensheet made using the method and composition of the invention on the top and/or bottom of the stack; and sintering (heating) the stack to form the multilayer glass-ceramic substrate.

DESCRIPTION OF THE PREFERRED EMBODIMENT(s)

The glass-ceramic greensheet casting composition of the invention and of a conventional composition to make the internal layers of the MLC may be made using known techniques as described in U.S. Pat. No. 2,966,719 to Park, Jr.; U.S. Pat. No. 3,698,923 to Stetson et al.; U.S. Pat. No. 4,769,294 to Barringer et al. and U.S. Pat. No. 5,387,474 to Mikesha et al., which patents are hereby incorporated by reference. The composition typically termed a casting slip may be prepared by mixing the ingredients in a ball mill for a number of hours such as 8 hours to ensure that a homogeneous mixture is formed and desired viscosity obtained. The glass having the desired particle size and particle size distribution is used to make the casting composition. Corderite glass-ceramic powders have been found to be suitable. In general, the glass is quickly quenched after melting and thereafter ground to about 1–3 microns average particle size. Formulations for typical glass-ceramic powders are shown in U.S. Pat. No. 5,541,005. The binder may be selected from a wide variety of polymers such as polyvinyl butyral, polyvinyl alcohol, or an acrylic resin. The binder is preferably polyvinyl butyral. The solvent may also be selected from the wide variety of materials such as methyl ethylketone (MEK), methyl isobutyl ketone (MIBK), methanol, acetone, toluene, isopropyl alcohol, etc. A plasticizer such as dibutylphthlate is also preferably used in the formulation.

It is an important feature of the invention that a crystalline matrix forming nucleating agent be used in the greensheet casting composition to provide the glass-ceramic structure with a greater than 99% crystallinity after sintering. Nucleating agents in the glass used to make glass-ceramics such as $P_2O_5$, $TiO_2$, and $ZrO_2$ may be used with $P_2O_5$ being preferred. The nucleating agents are used in an amount of about 0.01 to 3% by weight of the glass composition. These, along with crystalline components such as a cordierite powder, can also be incorporated separately into the slurry at the time of casting.

Typically, the slip composition is prepared in a two stage milling process. In the first stage, solvent, binder, nucleating agent (if added separately) and plasticizer are mixed. In the second stage, the glass powder is added.

The binder serves to retain the glass and ceramic particles in undisrupted position as a tape after the organic solvent is evaporated from the cast slip. A typical conventional glass-ceramic greensheet casting composition by weight % is as follows:

|  | BROAD | PREFERRED |
|---|---|---|
| Glass/Ceramic | 40 to 60 | 45 to 55 |
| Binder | 2 to 10 | 4 to 8 |
| Solvent | 20 to 50 | 35 to 45 |
| Plasticizer | 0.5 to 5 | 1 to 2 |

For a casting composition of the invention, the nucleating agent, when added separately to the slurry, is used in an amount, by weight relative to the glass present, of about 50 to 5,000 ppm and preferably 200 to 500 ppm.

After the ingredients of the casting composition are mixed and homogenized, such as in a ball mill, a slip is formed having a viscosity which may vary from approximately 400 to 2000 centipoise or more. The slip can be de-aired by means well-known in the ceramic art. After de-airing, the slip is transferred to a slip reservoir where it is suitably maintained in a homogenous state. From the reservoir, the slip is discharged through a small orifice onto a substantially-horizontal flexible tape. The flexible supporting tape is typically a tape made of any impervious material, such as polytetrafluoroethylene "Teflon", glycol tetraphthalic acid polyester (Mylar) and the like. The casting sheet is pulled across the open bottom of the reservoir and under a doctor blade, which is set at a particular height to form the desired substrate thickness. The casting sheet should be supported on a smooth surface and then the solvent vaporized producing a leather hard flexible tape (termed a greensheet). The greensheet can then be punched before or after removal of the casting sheet to the desired substrate size.

The sheet may then be metallized as described above and stacked to form the desired multilayer glass-ceramic substrate laminate. It is this stack which is then layered on the top and/or bottom with a glass-ceramic greensheet made using the glass-ceramic greensheet coating composition of the invention. The stack is then fired (sintered) to form the final MLC product. When the greensheet of the invention is sintered, the sintered top and/or bottom layer is greater than 99% crystalline.

It is an important feature of the invention that the greensheets used for the top and/or bottom layers of the finished substrate be prepared using the casting composition described above. Using the composition and process of the invention, greensheets having a thickness typically between about 10 and 250 microns may be made using conventional equipment and provide enhanced strength and flexibility to the final MLC product.

Sintering of the multilayer ceramic laminate is conventionally performed using any of a number of heating profile cycles. In general, the sintering of ceramic and, especially, alumina based MLC packages, is typically performed in three distinct heating phases. The first phase pyrolysis breaks down large polymers and volatilizes the shorter chain organics. Pyrolysis is usually performed at a temperature below 500° C. for about 4–7 hours. The heating cycle where the binder and remaining organics are burned out of the package (termed BBO) is usually performed at a temperature above about 600° C., e.g., 500° C. to 800° C., for about 2–10 hours. Sintering including the crystallization of the glass-ceramic powders is then completed at a temperature between 900° C. and 1000° C. to form the final MLC package. The total heating cycle is typically performed in a sintering environment which is a reducing atmosphere such as $H_2$ or $H_2$ and $N_2$.

EXAMPLE

Ceramic slurry compositions as shown in Table 1 below were formed by mixing the components in a ball mill for about 8 hours. Formulation A is made using a glass-ceramic composition 1 as listed in Table 2. Formulation B uses glass-ceramic composition 2 in Table 2. The fired (crystallized) CTE's of these glass-ceramics is 3 and 2 ppm/° C. respectively. The glass has been ground to form a powder with average particle size of approximately 3 microns.

TABLE 1

| | Formulation (% by weight) | |
|---|---|---|
| COMPONENT | A | B |
| Glass Frit (Balance) | Composition 1 | Composition 2 |
| Solvent | 32 | 33 |
| Plasticizer | 1 | 1 |
| Polyvinyl butyral | 4 | 4 |
| Nucleating agent * | <500 ppm | <500 ppm |

*In both cases the nucleating agent is a crystalline cordierite-like powder.

TABLE 2

| | Glass Composition (% by weight) | |
|---|---|---|
| Component | 1 | 2 |
| $S_iO_2$ | 55.0 | 54.0 |
| $Al_2O_3$ | 21.1 | 21.5 |
| $M_gO$ | 22.3 | 21.2 |
| $B_2O_3$ | 1.3 | 2.8 |
| $P_2O_5$ | 0.3 | 1.0 |

Greensheets were prepared by tape casting with a commercial doctor blade using a polymer carrier film. The greensheets made using composition A were 8 mils thick. The greensheets made using composition B of the invention were 4 mil thick.

The use of a compressive glass ceramic layer on each side of the substrate as TSM and BSM ceramic dielectric layers increases the strength of the substrate to that of alumina based ceramic MLCs. Blank glass ceramic substrates were made using composition A as internal layers with surface layers of composition B. Two laminate of types using 10 layers of internal greensheets A and a top, and top and bottom of greensheet B were made. The laminate was heated and the binder pyrolyzed up to 700° C. for 10 hours. The laminate was then heated in a BBO cycle at 700° C. for 10 hours and the glass sintered and crystallized between 800 to 970° C. with a hold for 4 hours at high temperature. The discs were then tested in a ring-on-ring loading configuration for fracture strength.

Data measured for the fired glass ceramic disc layer configurations below show a remarkable strength effect from the use of a glass ceramic layer of the invention on conventional core layers.

TABLE 3

| SAMPLE | Construction | Strength/Standard Deviation (Kpsi) |
| --- | --- | --- |
| (1) | All Greensheet A | 33.5/3.6 (CONTROL) |
| (2) | Greensheet B on top | 38.1/- |
| (3) | Greensheet B on top and bottom | 51.2/2.7 |

There is almost a 15% increase in strength when only a single strengthening layer is used on the top (sample 2). There is a greater than 50% increase in strength when using a top and bottom layer of the invention. The data is on as fired glass-ceramic surfaces. No polishing or surface treatment was used.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for fabricating a multi-layer glass-ceramic electronic component having enhanced strength comprising the steps of:

forming a first glass-ceramic greensheet casting composition comprising a ceramic, crystallizable glass containing a nucleating agent, a binder resin and a solvent;

forming first greensheets from the first composition, the greensheets having metallization thereon and metallized via interconnections, the first greensheets characterized by having a post fired first coefficient of thermal expansion, and a microstructure which is greater than 99% crystalline;

stacking a plurality of the first greensheets to form a first stack;

stacking on the top of the first stack, bottom of the first stack or both the top and bottom of the first stack, at least one layer of a second greensheet made using a second glass-ceramic greensheet casting composition comprising a ceramic, crystallizable glass containing a nucleating agent, a binder resin and a solvent system, the second greensheets characterized by having a post fired second coefficient of thermal expansion which is lower than the first coefficient of thermal expansion and a microstructure which is greater than 99% crystalline; and sintering the stack to form the multi-layer glass-ceramic electronic component.

2. The process of claim 1 wherein the nucleating agent Is selected from the group consisting of $P_2O_5$, $TiO_2$ and $ZrO_2$.

3. The process of claim 2 wherein the nucleating agent is in an amount of about 0.01 to 3% by weight of the glass composition.

4. The process of claim 1 wherein the multi-layer glass-ceramic electronic component product made by the process is used as an electronic component.

5. A multi-layer glass-ceramic electronic component made using the process of claim 1.

6. A multi-layer glass-ceramic electronic component made using the process of claim 2.

7. A multi-layer glass-ceramic electronic component made using the process of claim 3.

* * * * *